(12) United States Patent
Watts

(10) Patent No.: US 6,936,194 B2
(45) Date of Patent: Aug. 30, 2005

(54) FUNCTIONAL PATTERNING MATERIAL FOR IMPRINT LITHOGRAPHY PROCESSES

(75) Inventor: Michael P. C. Watts, Austin, TX (US)

(73) Assignee: Molecular Imprints, Inc., Austin, TX (US)

(*) Notice: Subject to any disclaimer, the term of this patent is extended or adjusted under 35 U.S.C. 154(b) by 357 days.

(21) Appl. No.: 10/235,314

(22) Filed: Sep. 5, 2002

(65) Prior Publication Data

US 2004/0046271 A1 Mar. 11, 2004

(51) Int. Cl.[7] .............................................. B29D 11/00
(52) U.S. Cl. .................... 264/1.25; 264/1.27; 264/1.36; 264/1.7
(58) Field of Search ................................. 264/1.1, 1.24, 264/1.31, 1.25, 1.27, 1.7, 1.36, 1.38

(56) References Cited

U.S. PATENT DOCUMENTS

| | | |
|---|---|---|
| 4,731,155 A | 3/1988 | Napoli et al. |
| 4,959,252 A | 9/1990 | Bonnebat et al. |
| 5,259,926 A | 11/1993 | Kuwabara et al. |
| 5,357,122 A | 10/1994 | Okubora et al. |
| 5,369,722 A * | 11/1994 | Heming et al. ............. 385/130 |
| 5,425,848 A | 6/1995 | Haisma et al. |
| 5,480,047 A | 1/1996 | Tanigawa et al. |
| 5,669,303 A | 9/1997 | Maracas et al. |
| 5,772,905 A | 6/1998 | Chou |
| 5,900,160 A | 5/1999 | Whitesides et al. |
| 5,948,470 A | 9/1999 | Harrison et al. |
| 6,039,897 A | 3/2000 | Lochhead et al. |
| 6,128,085 A | 10/2000 | Buermann et al. |
| 6,143,412 A | 11/2000 | Schueller et al. |
| 6,168,845 B1 | 1/2001 | Fontana, Jr. et al. |
| 6,180,239 B1 | 1/2001 | Whitesides et al. |
| 6,218,316 B1 | 4/2001 | Marsh |
| 6,334,960 B1 | 1/2002 | Willson et al. |
| 6,335,149 B1 | 1/2002 | Xu et al. |
| 6,437,891 B1 | 8/2002 | Chandrasekhar et al. |
| 6,475,704 B1 * | 11/2002 | Iwasaki et al. ............. 430/321 |

FOREIGN PATENT DOCUMENTS

| | | |
|---|---|---|
| JP | 1-196749 | 8/1989 |
| WO | WO 01/69317 | 9/2001 |
| WO | WO 01/90816 | 11/2001 |

OTHER PUBLICATIONS

Eldada et al. "Advanced Polymer Systems for Optoelectronic Integrated Circuit Applications", SPIE vol. 3006, pp. 344–361 (1997).

Eldada et al. "Affordable WDM Components: the polymer solution", SPIE vol. 3234, pp. 161–174 (1998).

Eldada et al. Robust Photopolymers for MCM, Board, and Backplane Optical Interconnects, SPIE vol. 3288, pp. 175–191 (1998).

(Continued)

Primary Examiner—Mathieu D. Vargot
(74) Attorney, Agent, or Firm—Kenneth C. Brooks

(57) ABSTRACT

The present invention provides a method for forming an optical coupling device on a substrate by disposing a material onto the substrate that is polymerizable in response to actinic radiation. A stack of the material is formed by contacting the material with a template having a stepped-recess formed therein. The material is then solidified into an optically transparent body with a surface having a plurality of steps by subjecting the stack to actinic radiation. To that end, the material may comprise an acrylate component selected from a set of acrylates consisting essentially of ethylene dio diacrylate, t-butyl acrylate, bisphenol A diacrylate, acrylate terminated polysiloxane, polydifluoromethylene diacrylate, perfluoropolyether diacrylates and chlorofluorodiacrylates. Alternatively, the material may include a silylated component selected from a group consisting essentially of (3-acryloxypropyltristrimethylsiloxy) silane.

21 Claims, 3 Drawing Sheets

OTHER PUBLICATIONS

Blomquist et al. "Fluorinated Acrylates in Making Low–Loss, Low–Birefringence, and Single–Mode Optical Waveguides with Exceptional Thermo–Optic Properties", SPIE vol. 3799, pp. 266–279 (1999).

Gokan et al., "Dry Etch Resistance of Organic Materials," J. Electrochem. Soc. 130:1, 143–146 (Jan. 1983).

Lin, "Multi–Layer Resist Systems", Introduction of Microlithography, American Chemical Society, 1983, pp. 287–350, IBM T.J. Watson Research Center, Yorktown Heights, New York 10598.

Krug et al., "Fine Patterning of Thin Sol–Gel Films," Journal of Non–Crystalline Solids, 1992, pp. 447–450, vol. 147 & 148.

Krauss et al., "Fabrication of Nanodevices Using Sub–25nm Imprint Lithography," Appl. Phys. Lett 67(21), 3114–3116, 1995.

Chou et al., "Imprint of Sub–25nm Vias and Trenches in Polymers," Applied Physics Letters, Nov. 20, 1995, pp. 3114–3116, vol. 67(21).

Chou et al., "Imprint Lithography with 25–Nanometer Resolution," Science, Apr. 5, 1996, pp. 85–87, vol. 272.

Haisma et al., "Mold–Assisted Nanolithography: A Process for Reliable Pattern Replication," Journal of Vacuum Science and Technology, Nov/Dec 1996, pp. 4124–4128, vol. B 14(6).

Chou et al., "Imprint Lithography with Sub–10nm Feature Size and High Throughput," Microelectronic Engineering, 1997, pp. 237–240, vol. 35.

Scheer et al., "Problems of the Nanoimprinting Technique for Nanometer Scale Pattern Definition," Journal of Vacuum Science and Technology, Nov/Dec 1998, pp. 3917–3921, vol. B 16(6).

Colburn. et al., "Step and Flash Imprint Lithography: A New Approach to High–Resolution Patterning", Proc. of SPIE, 1999, pp. 379–389, vol. 3676.

Choi et al., "High Precision Orientation Alignment and Gap Control Stages for Imprint Lithography Processes," U.S. Appl. No. 09/698,317, filed Oct. 27, 2000..

Sreenivasan et al., "High–Resolution Overlay Alignment Methods and Systems for Imprint Lithography," U.S. Appl. No. 09/907,512, filed Jul. 16, 2001.

Choi et al., "Method and System of Automatic Fluid Dispensing for Imprint Lithography Processes," U.S. Appl. No. 09/908,455, filed Jul. 17, 2001.

Choi et al., "Methods for High–Precision Gap and Orientation Sensing Between a Transparent Template and Substrate for Imprint Lithography," U.S. Appl. No. 09/920,341, filed Aug. 1, 2001.

Nguyen, A. Q., "Asymmetric Fluid–Structure Dynamics in Nanoscale Imprint Lithography," University of Texas at Austin, Aug. 2001.

Choi et al., "Flexture Based Macro Motion Translation Stage," U.S. Appl. No. 09/934,248, filed Aug. 21, 2001.

Bailey et al., "Template for Room Temperature Low Pressure Micro– and Nano–Lithography," U.S. Appl. No. 09/976,681, filed Oct. 12, 2001.

Voisin, "Methods of Manufacturing a Lithography Template," U.S. Appl. No. 10/136,188, filed May 1, 2002.

Willson et al., "Method and System for Fabricating Nanoscale Patterns in Light Curable Compositions Using an Electric Field," U.S. Appl. No. 09/905,718, filed May 16, 2002.

Watts et al., "System and Method for Dispensing Liquids," U.S. Appl. No. 10/191,749, filed Jul. 9, 2002.

Sreenivasan et al., "Step and Repeat Imprint Lithography Systems," U.S. Appl. No. 10/194,414, filed Jul. 11, 2002.

Sreenivasan et al., "Step and Repeat Imprint Lithography Processes," U.S. Appl. No. 10/194,991, filed Jul. 11, 2002.

* cited by examiner

US 6,936,194 B2

FUNCTIONAL PATTERNING MATERIAL FOR IMPRINT LITHOGRAPHY PROCESSES

BACKGROUND OF THE INVENTION

The field of invention relates generally to microfabrication of structures. More particularly, the present invention is directed to a functional patterning material suited for use in imprint lithographic processes to form optical components.

Optical communication systems include numerous optical devices, such as planar optical slab waveguides, channel optical waveguides, rib waveguides, optical couplers, optical splitters, optical switches, micro-optical elements and the like. Many of these optical devices are employed using standard photolithographic processes. As a result, many photopolymers have been developed. The photopolymers, such as acrylate materials, are light sensitive to facilitate recordation of a pattern therein. Furthermore, the photopolymers must demonstrate suitable operational and process characteristics. For example, it is desired that the photopolymers have good clarity and low birefringence over a range of temperatures. As a result, the thermal stability of the photopolymers is an important factor and should be such that the probability of color changes in the photopolymers is minimized during prolonged operation. Additionally, the photopolymers should withstand stresses so as not to crack during the baking process or during use. Finally, maximizing the miniaturization of the optical devices is desired. Recent advances in micro-fabrication techniques, have showed promising results in miniaturizing optical devices.

An exemplary micro-fabrication technique, commonly referred to as imprint lithography, is shown in U.S. Pat. No. 6,334,960 to Willson et al. Willson et al. disclose a method of forming a relief image in a structure. The method includes providing a substrate having a transfer layer. The transfer layer is covered with a polymerizable fluid composition. A mold makes mechanical contact with the polymerizable fluid. The mold includes a relief structure, and the polymerizable fluid composition fills the relief structure. The polymerizable fluid composition is then subjected to conditions to solidify and polymerize the same, forming a solidified polymeric material on the transfer layer that contains a relief structure complimentary to that of the mold. The mold is then separated from the solid polymeric material such that a replica of the relief structure in the mold is formed in the solidified polymeric material. The transfer layer and the solidified polymeric material are subjected to an environment to selectively etch the transfer layer relative to the solidified polymeric material such that a relief image is formed in the transfer layer. The time required and the minimum feature dimension provided by this technique is dependent upon, inter alia, the composition of the polymerizable material. However, Willson et al. does not disclose material suitable for use in forming optical devices employed in communication systems that may be formed using imprint lithography.

It is desired, therefore, to provide techniques to form optical devices using imprint lithographic processes.

SUMMARY OF THE INVENTION

The present invention includes a method for forming an optical coupling device on a substrate by disposing a material onto the substrate that is polymerizable in response to actinic radiation. A stack of the material is formed by contacting the material with a template having a stepped-recess formed therein. The material is then solidified into an optically transparent body with a surface having a plurality of steps by subjecting the stack to actinic radiation. To that end, the material may comprise a polymerizable acrylate component selected from a set of acrylates consisting essentially of ethylene di diacrylate, t-butyl acrylate, bisphenol A diacrylate, acrylate terminated polysiloxane, polydifluoromethylene diacrylate, perfluoropolyether diacrylates and chlorofluorodiacrylates. Alternatively, the material may include a silylated component selected from a group consisting essentially of (3-acryloxypropyltristrimethylsiloxy) silane. In yet another embodiment of the present invention, a stress relief layer may be disposed on the substrate before formation of the stack to reduce the probability of the stack cracking during operation. Thereafter, the material may be disposed on the stress relief layer. One embodiment of the stress relief layer may be formed from rubbers, such as polysiloxane rubber and fluorosilocane rubber. These and other embodiments are described herein.

DETAILED DESCRIPTION OF THE PREFERRED EMBODIMENTS

Figure 1:
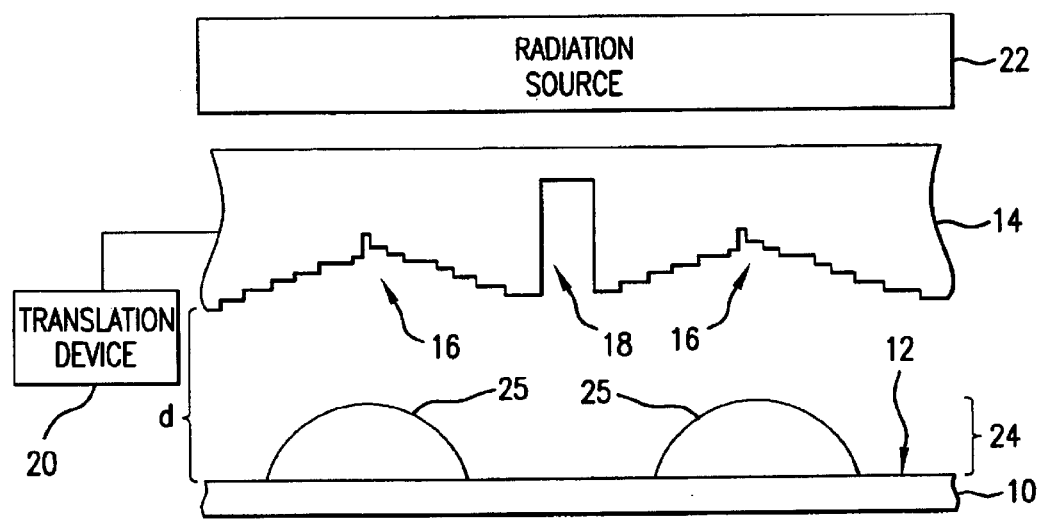
FIG. 1 is a simplified elevation view of a lithographic system in accordance with the present invention.

Referring to FIG. 1, a lithographic system in accordance with an embodiment of the present invention includes a substrate 10, having a substantially planar region shown as surface 12. Disposed opposite substrate 10 is an imprint device 14 having a plurality of features thereon, forming a plurality of spaced-apart stepped-recesses 16 separated by a groove 18, which should be deeper than stepped-recesses 16, typically 10–20 µm. Although two stepped-recessed regions 16 are shown, any number may be present. The stepped recesses 16 extend parallel to groove 18. A translation device 20 is connected between imprint device 14 and substrate 10 to vary a distance "d" between imprint device 14 and substrate 10. A radiation source 22 is located so that imprint device 14 is positioned between radiation source 22 and substrate 10. Radiation source 22 is configured to impinge radiation on substrate 10. To realize this, imprint device 14 is fabricated from material that allows it to be substantially transparent to the radiation produced by radiation source 22.

Figure 2:
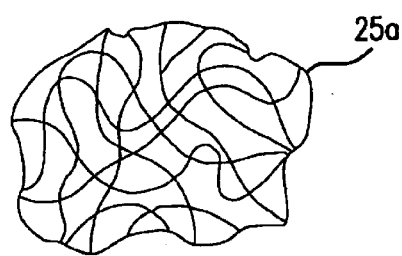
FIG. 2 is a simplified representation of material from which an imprint layer, shown in FIG. 1, is comprised before being polymerized and cross-linked.

Referring to both FIGS. 1 and 2, an imprint layer 24 is disposed adjacent to surface 12, between substrate 10 and imprint device 14. Although imprint layer 24 may be deposited using any known technique, in the present embodiment, imprint layer 24 is deposited as a plurality of spaced-apart discrete beads 25 of material 25a on substrate 10, discussed more fully below. Imprint layer 24 is formed from a material 25a that may be selectively polymerized and cross-linked to record a desired pattern. Material 25a is shown in FIG. 3 as being cross-linked at points 25b, forming cross-linked polymer material 25c.

Figure 4:
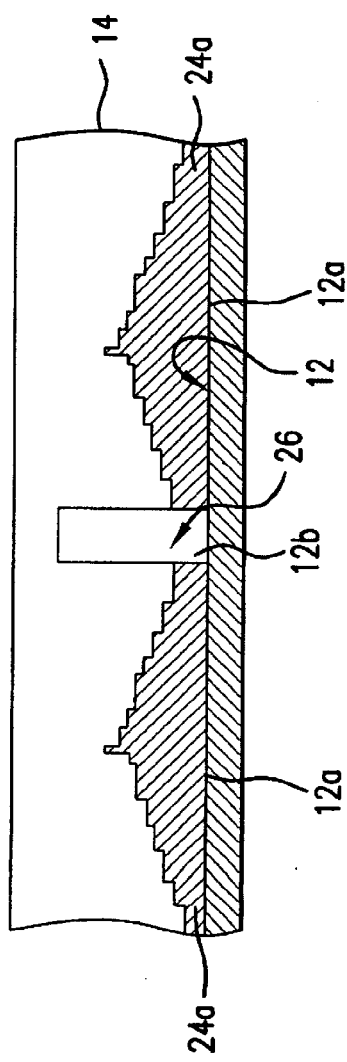
FIG. 4 is a simplified elevation view of an imprint device, shown in FIG. 1, in mechanical contact with an imprint layer disposed on a substrate, in accordance with one embodiment of the present invention.

Referring to FIGS. 1, 2 and 4, the pattern recorded by imprint layer 24 is produced, in part, by mechanical contact with imprint device 14. To that end, translation device 20 reduces the distance "d" to allow imprint layer 24 to come into mechanical contact with imprint device 14, spreading beads 25 so as to form imprint layer 24 with a contiguous formation of material 25a over regions 12a of surface 12, which are in superimposition with stepped-recesses 16. A region 12b of surface 12 in superimposition with groove 18 is devoid of material 25a. This occurs by providing beads 25 with a requisite volume so that stepped-recesses 16 become filled, but, due to capillary action, material from which beads 25 are formed does not enter groove 18. As a result, the material of beads 25 are provided with the requisite viscosity that may vary, dependent, inter alia, upon the size of groove 18, stepped-recess 16 and distance "d". As a result there is a discontinuity, or hiatus 26, in layer 24. In one embodiment, distance "d" is reduced to allow sub-portions 24a of imprint layer 24 to ingress into and fill stepped-recesses 16, while avoiding filling of groove 18.

To facilitate filling of stepped-recesses 16 and avoiding the presence of material 25a in hiatus 26, material 25a is provided with the requisite viscosity to completely fill stepped-recesses 16 in a timely manner, while covering regions 12a of surface 12 with a contiguous formation of material 25a, on the order of a few milliseconds to a few seconds. In the present embodiment, sub-portions 24a of imprint layer 24 coextensive with regions 12a have a stepped profile and are separated from adjacent sub-portions 24a by hiatus 26, after distance "d" has reached a desired distance, usually a minimum distance. After a desired distance "d" has been reached, radiation source 22 produces actinic radiation that polymerizes and cross-links material 25a, forming cross-link polymer material 25c, shown in FIG. 3.

Figure 3:
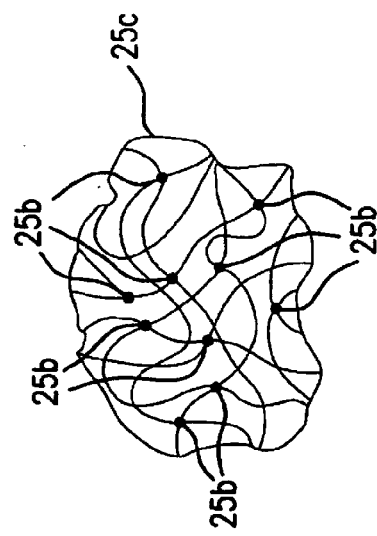
FIG. 3 is a simplified representation of cross-linked polymer material into which the material shown in FIG. 2 is transformed after being subjected to radiation.

Referring to FIGS. 1 and 3, an exemplary radiation source 22 may produce ultraviolet radiation. Other radiation sources may be employed, such as thermal, electromagnetic and the like. The selection of radiation employed to initiate the polymerization of the material in imprint layer 24 is known to one skilled in the art and typically depends on the specific application that is desired. After imprint layer 24 is transformed to consist of material 25c, translation device 20 increases the distance "d" so that imprint device 14 and imprint layer 24 are spaced-apart.

Referring to FIGS. 1, 2 and 3, additional processing may be employed to complete the patterning of substrate 10. For example, substrate 10 and imprint layer 24 may be etched to remove residual material (not shown) present on imprint layer 24 after patterning has been completed. Residual material (not shown) may consist of un-polymerized material 25a, solid polymerized and cross-linked material 25c, substrate 10 or a combination thereof. Well known etching processes may be employed to that end, e.g., argon ion milling, a plasma etch, reactive ion etching or a combination thereof. Further, removal of residual material (not shown) may be accomplished during any stage of the patterning. For example, removal of residual material (not shown) may be carried out before etching the polymerized and cross-linked material 25c.

Figure 5:
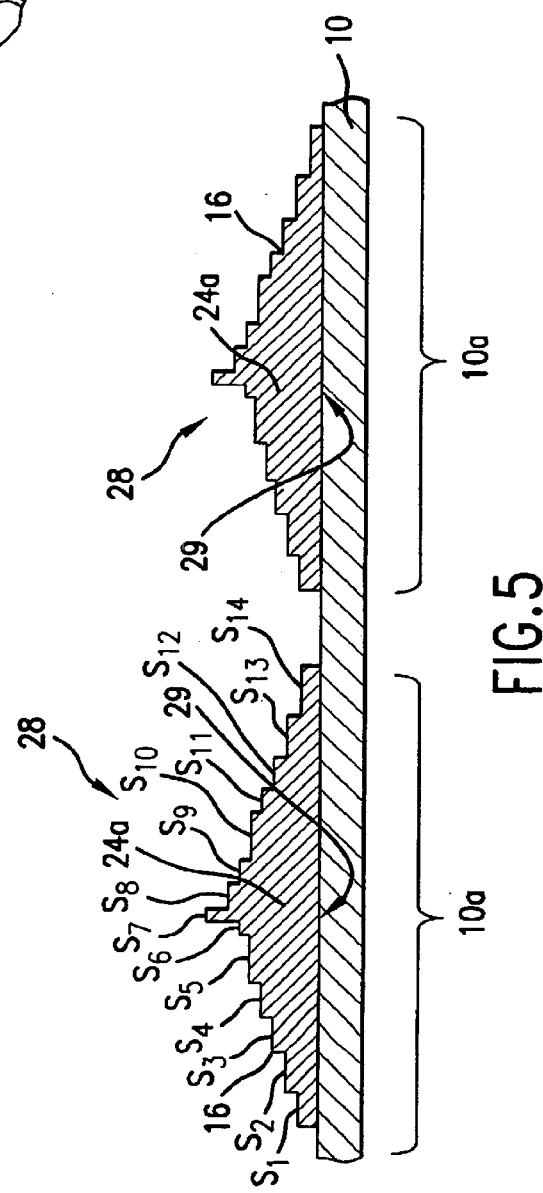
FIG. 5 is a simplified elevation view of the imprint layer, shown in FIG. 4, after patterning.

Referring to FIGS. 2, 3, and 5, polymerization of material 25a solidifies the surface of sub-portions regions 24a with a shape conforming to a shape of stepped-recesses 16. This provides sub-portions 24a with multiple steps, $s_1$–$s_{14}$ having differing thicknesses, with thickness being measured in a direction parallel to distance "d". Material 25a is selected so that steps $s_1$–$s_{14}$ define an optical coupling device 28 that propagates optical energy impinging thereupon after polymerization into material 25c. For example, optical energy may impinge upon surface 29 and propagate outwardly away from optical coupling device 28 through the surfaces associated with steps $s_1$–$s_{14}$.

As a result, optical coupling device 28, which includes sub-portions 24a and regions 10a of substrate 10 that are coextensive with regions 12a, shown in FIG. 4, should be formed with material that is transparent to desired optical frequencies. An exemplary embodiment forms optical coupling device 28 from materials that facilitates propagation of optical energy in a range of 850 nm to 1,550 nm. In addition, the materials should demonstrate operational characteristics so as to withstand various environmental stresses without varying the optical properties of the optical coupling device 28 by, for example, 5 to 10%.

Another operational characteristic that optical coupling device 28 should satisfy is maintaining structural integrity during operation. To that end, optical coupling device 28 should withstand thermal cycling without cracking. Thus, for a given material from which substrate 10 is formed, material 25c should maintain structural integrity when subjected changes in the ambient temperature, e.g., 0° C. to 70° C. in which optical coupling device 28 is employed. Material 25c should also maintain structural integrity when subjected to temperature changes due to the periodicity at which optical energy impinges upon optical coupling device 28, as well as, differences in coefficient of thermal expansion (ΔCTE) of material 25c from which optical coupling device 28 is formed and the material from which substrate 10 is formed.

Referring to FIGS. 1, 2, 3 and 4, in addition to the operational characteristics that material 25c should satisfy, it is desirous to have material 25a satisfy numerous processing characteristics considering the unique deposition process employed. As mentioned above, material 25a is deposited on substrate 10 as a plurality of discrete and spaced-apart beads 25. The combined volume of beads 25 is such that the material 25a is distributed appropriately over an area of regions 12a, while avoiding the presence of material in region 12b. As a result, imprint layer 24 is spread and patterned concurrently, with the pattern being subsequently set by exposure to actinic radiation, such as ultraviolet radiation. Thus, in addition to the operational characteristics mentioned above, it is desired that material 25a have certain processing characteristics to facilitate rapid and even spreading of material 25a in beads 25 over regions 12a while avoiding the presence of material 25a in region 12b.

The desirable processing characteristics include having a viscosity approximately that of water, ($H_2O$), 1 to 2 centepoise (csp), or in some cases as high as 20–50 cps, dependent upon the lateral dimensions of the features, as well as the ability to wet surface of substrate 10 to avoid subsequent pit or hole formation after polymerization. To that end, in one example, the wettability of imprint layer 24, as defined by the contact angle method, should be such that the angle, $\theta_1$, is defined as follows:

$$0 \geq \theta_1 < 75°$$

With these two characteristics being satisfied, imprint layer 24 may be made sufficiently thin while avoiding formation of pits or holes in the thinner regions.

Referring to FIGS. 1, 2, 3 and 5, another desirable characteristic that it is desired for material 25a to possess is thermal stability during further manufacturing processes and post process testing. To that end, it is desired that the structural integrity of optical coupling device 28 be maintained when subjected to wave soldering at 260° C. for ninety (90) seconds, e.g., three (3) intervals at thirty (30) seconds per interval. Additionally, it is desirous to have optical coupling device 28 maintain structural integrity when subjected to thermal cycling between −40° to 100° C. with a fifteen (15) minute dwell time at the endpoints of the temperature ranges and a five (5) minute transition time between temperatures. Finally, it is desirous to have optical coupling device 28 maintain structural integrity when subjected to an 85° C. ambient of 85% humidity for 1,000 hours. It is further desired that the wetting of imprint device 14 by imprint layer 24 be minimized. To that end, the wetting angle, $\theta_2$, should be greater than 75°.

Referring to FIGS. 2 and 4, the constituent components that form material 25a to provide the aforementioned operational and process characteristics may differ. This results from substrate 10 being formed from a number of different materials. For example, substrate 10 may be formed from silica, polymers, cadmium telluride, quartz and virtually any other electro-optic material. Additionally, substrate 10 may include one or more layers in regions 12a, discussed more fully below.

Referring to FIGS. 2 and 3, in one embodiment of the present invention the constituent components of material 25a consist of acrylated polymerizable compositions and an initiator. The polymerizable compositions are selected to provide material 25a with a minimal viscosity, e.g., viscosity approximating the viscosity of water (1–2 cps) or up to 10–50 cps, and to provide the aforementioned operational and process characteristics. The initiator is provided to produce a free radical reaction in response to actinic radiation, causing the polymerizable compositions to polymerize and cross-link, forming cross-linked polymer material 25c. In the present example, a photo-initiator responsive to ultraviolet radiation is employed.

Examples of polymerizable compositions include, but are not limited to, ethylene diol diacrylate, t-butyl acrylate, bisphenol A diacrylate, acrylate terminated polysiloxane, as well as compositions thereof. Other acrylates may also include fluorinated acrylates as described by Blomquist et al. in the article entitled FLUORINATED ACRYLATES IN MAKING LOW-LOSS, LOW-BIREFRINGENCE, AND SINGLE-MODE OPTICAL WAVEGUIDES WITH EXCEPTIONAL THERMO-OPTIC PROPERTIES, SPIE Vol. 3799, pp. 266–279 (1999). Examples of the fluorinated acrylates include polydifluoromethylene diacrylates, perfluoropolyether diacrylates and chlorofluorodiacrylates. The initiator may be any component that initiates a free radical reaction in response to radiation, produced by radiation source 22, shown in FIG. 1, impinging thereupon and being absorbed thereby. Suitable initiators may include, but are not limited to, photo-initiators such as 1-hydroxycyclohexyl phenyl ketone or phenylbis(2,4,6-trimethyl benzoyl) phosphine oxide. The initiator may be present in material 25a in amounts of up to 5% by weight, but is typically present in an amount of 2–4% by weight. Were it desired to include silylated polymerizable compositions in material 25a, suitable silylated polymerizable compositions may include, but are not limited to, 1,3-bis(3-methacryloxypropyl) tetramethyldisiloxane, (3-acryloxypropyl)tris(tri-methoxysiloxy)-silane.

Other compositions that material 25a may consist of include epoxies, such as cyclo aliphatic epoxies. An exemplary cyclo aliphatic epoxy that may demonstrate the aforementioned operational and process characteristics is available from Union Carbide as part number ERL 4221. Additionally some vinyl ethers may demonstrate the aforementioned operational and process characteristics, e.g., polyvinyl ether and copolymers, such as isobutyl ethers used in conjunction with acrylics.

Specific examples of compositions for material 25a are as follows:

Composition 1

96% ethylene dio diacrylate+4% initiator

Composition 2

96% 1,3-bis(3-methacryloxypropyl) tetramethyldisiloxane+4% initiator

Composition 3

44% (3-acryloxypropyl)tris(tri-methoxysiloxy)-silane+15% ethylene dio diacrylate+37% t-butyl acrylate+4% initiator Composition 4

48% acrylate Terminated poly siloxane+48% t-butyl acrylate+4% initiator

Composition 5

96% bisphenol A diacrylate+4% initiator

It should be understood that the relative mixture between the non-initiator components of the aforementioned compositions could vary by as much as 20%, dependent upon the stoichiometry. Also, the above-identified compositions may also include stabilizers that are well known in the chemical art to increase the operational life, as well as initiators.

Figure 6:
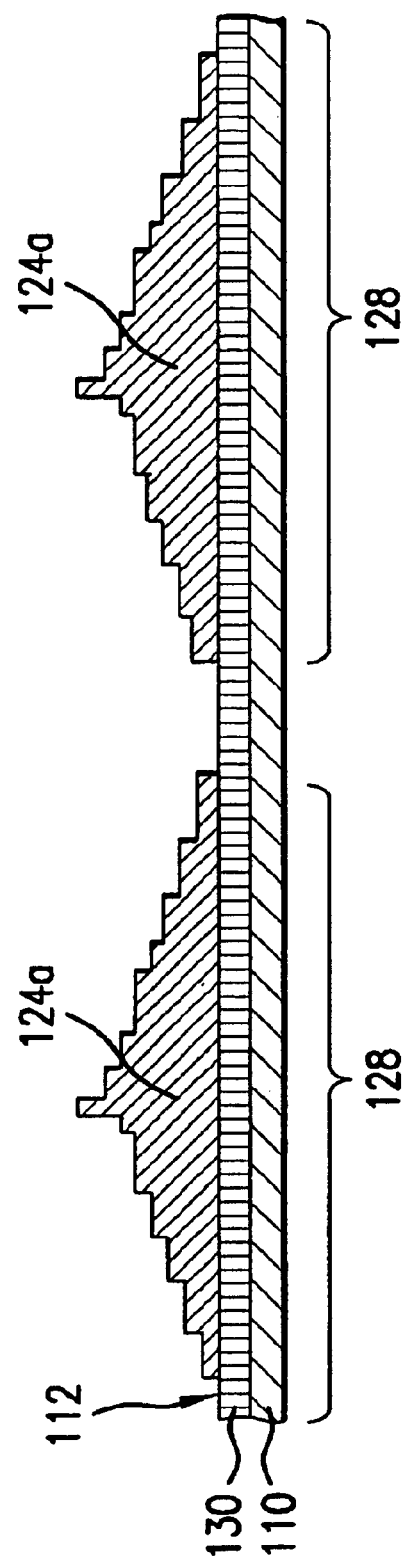
FIG. 6 is a simplified elevation view of material in an imprint device and substrate employed with the present invention in accordance with an alternate embodiment.

Referring to FIG. 6, another embodiment in accordance with the present invention provides an optical coupling device 128 that includes a stress relief layer 130 disposed between substrate 110 and sub-portions 124a. Stress relief layer 130 increases the selection of materials that may be employed to form optical coupling device 128. Specifically, stress relief layer 130 typically has a classification temperature Tg that is lower than the operational temperature of optical coupling device 128. This allows the use of materials having a Tg that is higher than the operational temperature of optical coupling device 128 without exacerbating the probability of cracking, because of the flexibility introduced by the presence of stress relief layer 130. To provide stress relief layer 130 with optical transparence to the radiation that will be used during operation, stress relief layer 130 may be formed from polysiloxane rubbers, with an acrylic end group attached thereto to facilitate cross-linking when exposed to ultraviolet radiation. Alternatively, the polysiloxane rubber may be thermally cross-linked. Stress relief layer 130 may be disposed upon substrate 110 using spin-on techniques. It is desired that the material from which stress relief layer 130 is formed does not swell in acrylate polymerizable compositions. As a result, fluorosilocane rubbers may be beneficial to include in stress relief layer.

Referring to FIGS. 2 and 6, an additional benefit provide by stress relief layer 130 is that the same may function as a planarization layer. As a result, stress relief layer 130 may provide an additional function of ensuring surface 112 is planar. To that end, stress relief layer 130 may be fabricated in such a manner so as to possess a continuous, smooth, relatively defect-free surface that may exhibit excellent adhesion to sub-portions 124a.

Referring again to FIG. 1, to ensure that imprint layer 24 does not adhere to imprint device 14, imprint device 14 may be treated with a modifying agent. One such modifying agent is a release layer (not shown) formed from a fluorocarbon silylating agent. Release layer (not shown) and other surface modifying agents, may be applied using any known process. For example, processing techniques that may include chemical vapor deposition method, physical vapor deposition, atomic layer deposition or various other techniques, brazing and the like. In this configuration, imprint layer 24 is located between substrate 10 and release layer (not shown), during imprint lithography processes.

The embodiments of the present invention described above are exemplary. Many changes and modifications may be made to the disclosure recited above, while remaining within the scope of the invention. For example, although the present embodiment is discussed with respect to having fourteen steps, any number of steps may be formed. The scope of the invention should, therefore, be determined not with reference to the above description, but instead with reference to the appended claims along with their full scope of equivalents.

What is claimed is:

1. A method of forming an optical coupling device on a substrate, said method including:
    forming a stress relief layer on said substrate
    producing, on said stress relief layer, an optically transparent body with a surface having a plurality of steps by disposing a material onto said stress relief layer, contacting said material with a template having a stepped recess formed therein and solidifying said material by exposing said material to actinic radiation.

2. The method as recited in claim 1 wherein producing further includes disposing said material with an acrylate component selected from a set of acrylates consisting essentially of ethylene diol diacrylate, t-butyl acrylate, bisphenol A diacrylate, acrylate terminated polysiloxane, polydifluoromethylene diacrylate, perfluoropolyether diacrylates and chlorofluorodiacrylates.

3. The method as recited in claim 1 wherein producing further includes disposing said material with a silylated component selected from a group consisting essentially of (3-acryloxypropyltristrimethylsiloxy) silane.

4. The method as recited in claim 1 further including fabricating said substrate from optically transparent material.

5. The method as recited in claim 1 wherein forming further includes fabricating said stress relief layer from rubbers of a set of rubbers consisting essentially of polysiloxane rubber and fluorosilocane rubber.

6. The method as recited in claim 1 wherein producing further includes disposing, on said stress relief layer, said material consisting essentially of ethylene diol diacrylate and an initiator.

7. The method as recited in claim 1 wherein producing further includes disposing, on said stress relief layer, said material consisting essentially of 1,3-bis(3-methacryloxypropyl)tetramethyldisiloxane and an initiator.

8. The method as recited in claim 1 wherein producing further includes disposing, on said stress relief layer, said material consisting essentially of (3-acryloxypropyl)tris(tri-methoxysiloxy)-silane, ethylene dio diacrylate, t-butyl acrylate, and an initiator.

9. The method as recited in claim 1 wherein producing further includes disposing, on said stress relief layer, said material consisting essentially of acrylate terminated poly siloxane, t-butyl acrylate, and an initiator.

10. The method as recited in claim 1 wherein producing further includes disposing, on said stress relief layer, said material consisting essentially of bisphenol A diacrylate, and an initiator.

11. A method of forming an optical coupling device on a substrate, said method including:
    forming said substrate with a stress relief layer;
    disposing a material onto said stress relief layer that is polymerizable in response to actinic radiation;
    forming a plurality of spaced-apart stacks of said material by contacting said material with a template have a stepped-recess formed therein; and
    solidifying said plurality of spaced-apart stacks of said material into an optically transparent body with a surface having a plurality of steps by subjecting said stacks to actinic radiation.

12. The method as recited in claim 11 wherein disposing said material on said stress relief layer further includes disposing said material on said stress relief layer, being formed from rubbers of a set of rubbers consisting essentially of polysiloxane rubber and fluorosilocane rubber.

13. The method as recited in claim 12 further including fabricating said substrate from optically transparent material.

14. The method as recited in claim 13 wherein disposing further includes disposing said material with an acrylate component selected from a set of acrylates consisting essentially of ethylene dio diacrylate, t-butyl acrylate, bisphenol A diacrylate, acrylate terminated polysiloxane, polydifluoromethylene diacrylate, perfluoropolyether diacrylates and chlorofluorodiacrylates.

15. The method as recited in claim 13 wherein disposing further includes disposing said material with a silylated component selected from a group consisting essentially of (3-acryloxypropyltristrimethylsiloxy) silane.

16. A method of forming an optical coupling device on a substrate, said method including:
    forming, on said substrate, a stress relief layer formed from rubbers of a set of rubbers consisting essentially of polysiloxane rubber and fluorosilocane rubber;
    disposing a material, onto said stress relief layer, that is polymerizable in response to actinic radiation;
    forming a plurality of spaced-apart stacks of said material by contacting said material with a template having a stepped-recess formed therein; and
    solidifying said plurality of spaced-apart stacks of material into an optically transparent body with a surface having a plurality of steps by subjecting said stacks to actinic radiation.

17. The method as recited in claim 16 wherein disposing further includes depositing said material from a set of materials consisting essentially of ethylene dio diacrylate and an initiator.

18. The method as recited in claim 16 wherein disposing further includes depositing said material from a set of materials consisting essentially of 1,3-bis(3-methacryloxypropyl)tetramethyldisiloxane and an initiator.

19. The method as recited in claim 16 wherein disposing further includes depositing said material from a set of materials consisting essentially of (3-acryloxypropyl)tris (tri-methoxysiloxy)-silane, ethylene dio diacrylate, t-butyl acrylate, and an initiator.

20. The method as recited in claim 16 wherein disposing further includes depositing said material from a set of materials consisting essentially of acrylate terminated poly siloxane, t-butyl acrylate, and an initiator.

21. The method as recited in claim 16 wherein disposing further includes depositing said material from a set of materials consisting essentially of bisphenol A diacrylate, and an initiator.

* * * * *